(12) United States Patent
Devins et al.

(10) Patent No.: US 6,615,167 B1
(45) Date of Patent: Sep. 2, 2003

(54) PROCESSOR-INDEPENDENT SYSTEM-ON-CHIP VERIFICATION FOR EMBEDDED PROCESSOR SYSTEMS

(75) Inventors: Robert J. Devins, Essex Junction, VT (US); Paul G. Ferro, South Burlington, VT (US); Robert D. Herzl, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/494,386

(22) Filed: Jan. 31, 2000

(51) Int. Cl.$^7$ ............................................. G06F 9/455
(52) U.S. Cl. ............................ 703/28; 703/23; 703/14; 716/1; 716/4; 716/18; 714/33; 714/36
(58) Field of Search ....................... 703/22, 28; 716/18, 716/1, 4; 714/36, 33

(56) References Cited

U.S. PATENT DOCUMENTS

| | | | | |
|---|---|---|---|---|
| 5,600,579 A | | 2/1997 | Steinmetz, Jr. | 364/578 |
| 5,740,183 A | * | 4/1998 | Lowe | 714/736 |
| 5,838,948 A | | 11/1998 | Bunza | 395/500 |
| 5,870,308 A | * | 2/1999 | Dangelo et al. | 716/18 |
| 6,052,524 A | * | 4/2000 | Pauna | 703/22 |
| 6,131,174 A | * | 10/2000 | Fischer et al. | 714/733 |
| 6,240,543 B1 | * | 5/2001 | Bhandari | 716/18 |
| 6,249,893 B1 | * | 6/2001 | Rajsuman et al. | 714/741 |
| 6,269,467 B1 | * | 7/2001 | Chang et al. | 716/1 |
| 6,374,380 B1 | * | 4/2002 | Sim | 714/727 |
| 6,427,224 B1 | * | 7/2002 | Devins et al. | 716/4 |
| 6,456,961 B1 | * | 9/2002 | Patil et al. | 703/14 |
| 6,484,280 B1 | * | 11/2002 | Moberly | 714/726 |
| 6,487,699 B1 | * | 11/2002 | Devins et al. | 716/4 |
| 6,539,522 B1 | * | 3/2003 | Devins et al. | 716/5 |

FOREIGN PATENT DOCUMENTS

| | | | | |
|---|---|---|---|---|
| GB | WO 91/03011 | * | 3/1991 | G06F/1/00 |

OTHER PUBLICATIONS

"Verifying IP–Core based System–On–Chip Designs" P. Chauhan, IEEE 0–7803–5632–2/99, Sep. 1999.*
"An Efficient Bus Architecture for System–On–Chip Design" B. Cordan, IEEE 1999 Custom Integrated Circuits Conference, 0–7803–5443–5/99.*
"Applying Hardware/software Co–Design to System–on–a–Chip" A. Berger, IEEE, 0–7803–5078–2/98, 1998.*

* cited by examiner

*Primary Examiner*—Hugh Jones
*Assistant Examiner*—Fred Ferris
(74) *Attorney, Agent, or Firm*—Connolly Bove Lodge & Hutz, LLP; Richard M. Kotulak; Larry J. Hume

(57) ABSTRACT

A method for efficiently changing the embedded processor type in verification of system-on-chip (SOC) integrated circuit designs containing embedded processors. The verification software is used to generate and apply test cases to stimulate components of a SOC design ("cores") in simulation; the results are observed and used to de-bug the design.

Typically, the embedded processor type changes as SOC designs change. However, changing the processor type may cause errors in verification due to the presence of processor-specific code distributed throughout the verification software. Thus, changing the processor type can entail a substantial re-write of the verification software.

In the method according to the present invention, in verification software for verifying a SOC design including an embedded processor, processor-specific code is localized in a processor driver. Consequently, when there is a need to change the processor type, only the processor driver needs to be changed or replaced, while the rest of verification code requires no changes. Verification is consequently more efficient.

19 Claims, 7 Drawing Sheets

PROCESSOR-INDEPENDENT SYSTEM-ON-CHIP VERIFICATION FOR EMBEDDED PROCESSOR SYSTEMS

CROSS REFERENCE TO RELATED APPLICATIONS

This application is related by common inventorship and subject matter to co-pending applications titled "Method of Controlling External Models in System-On-Chip Verification", "Simulator-Independent System-On-Chip Verification Methodology", "Method of Developing Re-Usable Software for Efficient Verification of System-On-Chip Integrated Circuit Designs", "Method for Efficient Verification of System-On-Chip Integrated Circuit Designs Including an Embedded Processor", and "Method for Re-Using System-On-Chip Verification Software in an Operating System". Until such time as the foregoing applications are assigned application numbers by the U.S. Patent and Trademark Office, they may be respectively referenced by the following applicant:attorney docket numbers: BUR990253US1:1806/00089; BUR990254US 1:1806/00090; BUR990255US 1: 1806/00091; BUR990256US1:1806/00092; BUR990259US1:1806/00095. The listed applications are assigned to International Business Machines Corporation and are entirely incorporated herein by this reference.

BACKGROUND OF THE INVENTION

The present invention relates to the testing of computer system designs by software simulation, and more particularly to a verification methodology for system-on-chip (SOC) designs which enables the substitution of different embedded processor models into a design for simulation to be accomplished efficiently.

The complexity and sophistication of present-day integrated circuit (IC) chips have advanced significantly over those of early chip designs. Where formerly a chip might embody relatively simple electronic logic blocks effected by interconnections between logic gates, currently chips can include combinations of complex, modularized IC designs often called "cores" which together constitute an entire "system-on-a-chip", or Soc.

In general, IC chip development includes a design phase and a verification phase for determining whether a design works as expected. The verification phase has moved increasingly toward a software simulation approach to avoid the costs of first implementing designs in hardware to verify them.

A key factor for developers and marketers of IC chips in being competitive in business is time-to-market of new products; the shorter the time-to-market, the better the prospects for sales. Time-to-market in turn depends to a significant extent on the duration of the verification phase for new products to be released.

As chip designs have become more complex, shortcomings in existing chip verification methodologies which extend time-to-market have become evident.

Typically, in verifying a design, a simulator is used. Here, "simulator" refers to specialized software whose functions include accepting software written in a hardware description language (HDL) such as Verilog or VHDL which models a circuit design (for example, a core as describe above), and using the model to simulate the response of the design to stimuli which are applied by a test case to determine whether the design functions as expected. The results are observed and used to de-bug the design In order to achieve acceptably bug-free designs, verification software must be developed for applying a number of test cases sufficient to fully exercise the design in simulation. In the case of SOC designs, the functioning of both the individual cores as they are developed, and of the cores interconnected as a system must be verified. Moreover, a complete SOC design usually includes an embedded processor core; simulation which includes a processor core tends to require an inordinate amount of time and computing resources, largely because the processor is usually the most complex piece of circuitry on the chip and interacts with many other cores.

It can be appreciated from the foregoing that verification of an SOC can severely impact time-to-market, due to the necessity of developing and executing software for performing the numerous test cases required to fully exercise the design.

However, inefficiencies in current verification methodologies exacerbate time pressures. Typically, the embedded processor type is different for different SOC designs. However, processor-specific code for configuring the processor core used in a particular SOC design may be distributed throughout the overall verification code, and executed on an as-needed basis. Consequently, if the processor core for which this specific code was written is replaced in simulation by a different processor core, for instance, to test a new SOC design, errors can occur. Typically, a substantial effort in locating and re-writing the processor-specific portions of the overall verification code to adjust for a change in processor type is required, incurring additional time-to-market delays.

A verification methodology is needed which addresses the foregoing problem.

SUMMARY OF THE INVENTION

According to the method of the present invention, in verification software for verifying a SOC design including an embedded processor, processor-specific code for performing processor-specific operations is localized in a processor driver. In response to requests from the verification software, the processor driver performs processor initialization and other processor-specific operations related to a particular embedded processor to be used in a verification test.

The method allows the processor type in a verification test to be readily changed, since processor-specific operations are centralized in the processor driver rather than distributed throughout the overall verification code. As a result, changing the processor type entails only changing or replacing the processor driver, while the rest of the verification code requires no changing. Consequently, verification is more efficient and time-to-market is reduced.

DETAILED DESCRIPTION OF THE INVENTION

In the method of the present invention, processor-specific operations in a test operating system (TOS) for core and SOC verification are localized in a processor-specific driver. The processor driver contains processor-specific code while the balance of the TOS is coded in a high-level programming language such as "C". The TOS utilizes a uniform application program interface (API) for invoking the processor driver, to provide independence from the particular processor type in a SOC design for the balance of the TOS code.

The TOS provides a framework for generating test cases to test an individual core and combinations of cores, including core combinations which are specific to a particular SOC design and comprise an embedded processor core. The term "core" as used herein refers to a module of logic representing a circuit design of any degree of complexity, which may be used as a component of a SOC. In its developmental stages, a core is typically embodied as a simulatable HDL program written at some level of abstraction, or in a mixture of abstraction levels, which can describe the function of the core prior to its actual physical implementation in silicon. Major levels of abstraction that are generally recognized include a behavioral level, a structural level, and a logic gate level. A core may be in the form of a netlist including behavioral, structural and logic gate elements. Ultimately, after verification, design logic represented by a core is physically implemented in hardware.

Figure 1:
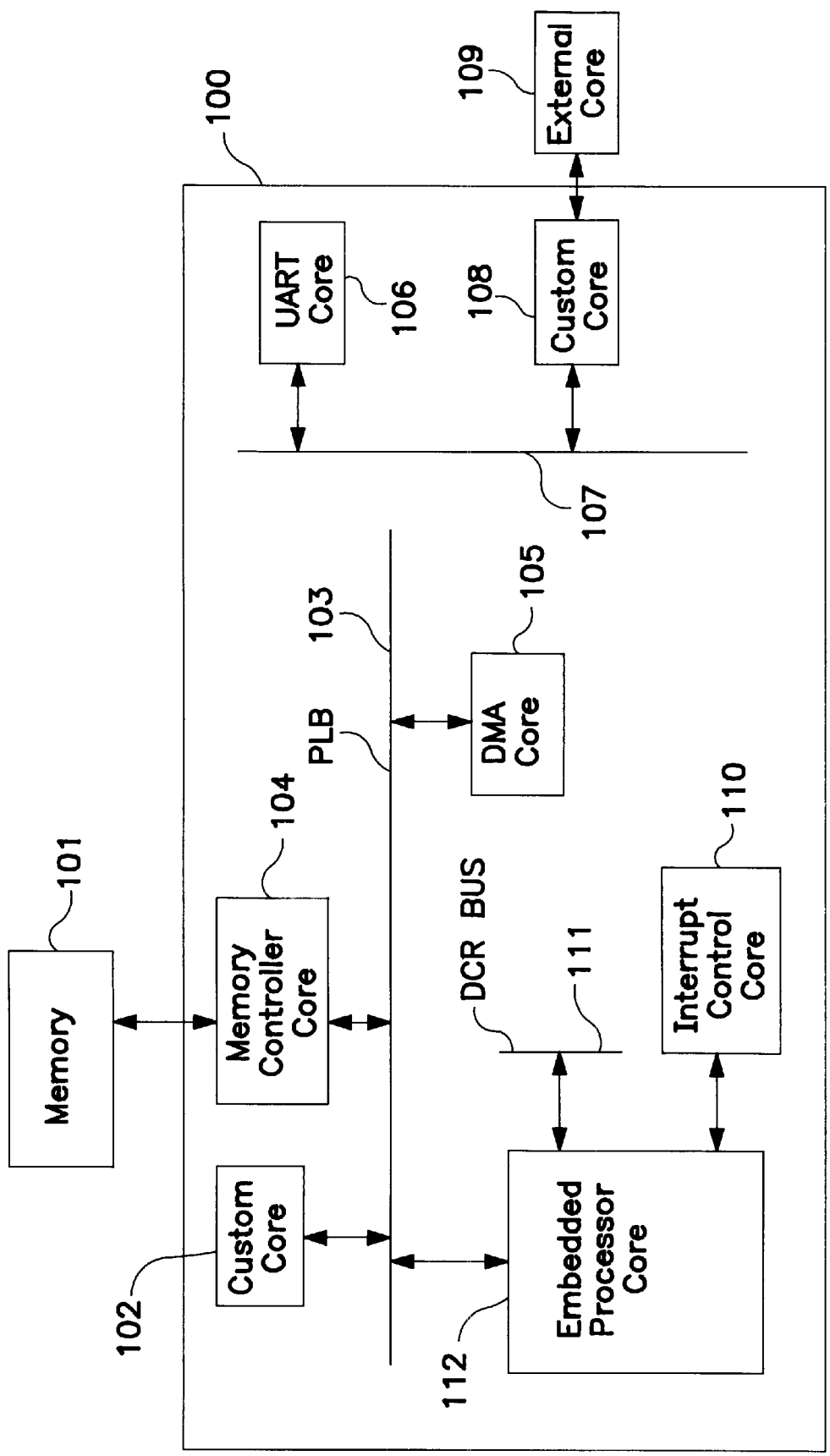
FIG. 1 shows an example of components of a SOC design.

FIG. 1 shows an example of components of a SOC design 100; the representation is intended to include embodiments in any known form of logic design, including simulatable HDL modules and netlists, and physical implementations. The SOC 100 includes a custom core 102 coupled to a processor local bus (PLB) 103, a memory controller 104 coupled to a memory core 101 and to the PLB, a Direct Memory Access (DMA) core 105 coupled to the PLB, a Universal Asynchronous Receiver Transmitter (UART) core 106 coupled to an on-chip peripheral bus (OPB) 107, a second custom core 108 coupled to a core 109 which is external to the chip, an interrupt control core 1coupled to an embedded processor core 112 and a device control register (DCR) bus 111 coupled to the embedded processor core. Memory core 101 is also external to the SOC 100.

Custom cores 102 and 108 represent design logic tailored to a particular application of the SOC. Other cores, such as the UART and DMA cores, may have well-standardized embodiments (sometimes called Application-Specific Integrated Circuits or ASICs) which are widely available from vendors. Typically, the design of a SOC comprises a combination of such custom cores and ASICs.

Figure 2A:
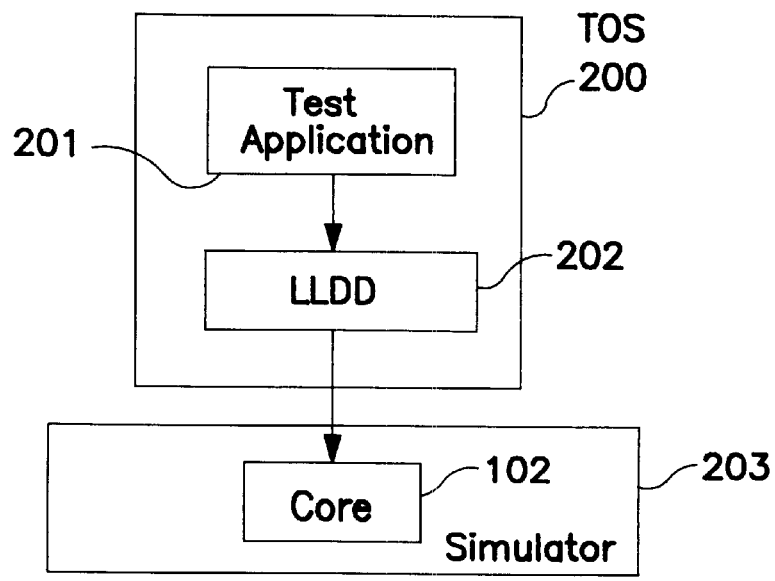
FIGS. 2A–2C show components of test operating system (TOS) software according to the invention.

As shown in FIG. 2A, to enable verification of a component core of a SOC design, the TOS 200 comprises at least a test application 201 which generates a test case which is applied by a low-level device driver (LLDD) 202 to a core; for example, custom core 102 implemented as an HDL module. Simulator 203 interprets HDL descriptions in the core 102 to simulate the behavior of a hardware device corresponding to the core, in response to the test stimulus.

The test case generated by the test application 201 typically comprises computer-executable instructions which generate stimuli to verify the design. The application of the test case typically produces, as output, results data representing the response of the simulated design which is compared to expected results, to determine whether the design functions as expected. The design may subsequently be revised to improve performance or de-bug errors.

Figure 2B:
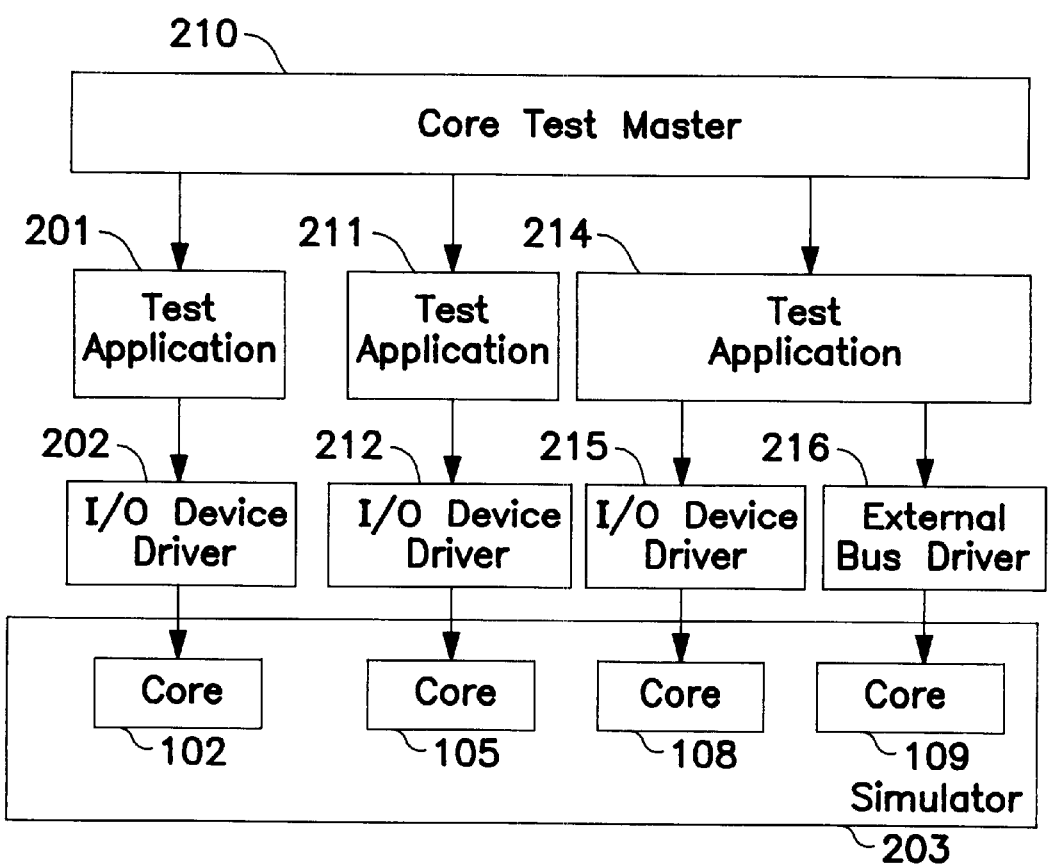
Figure 2C:
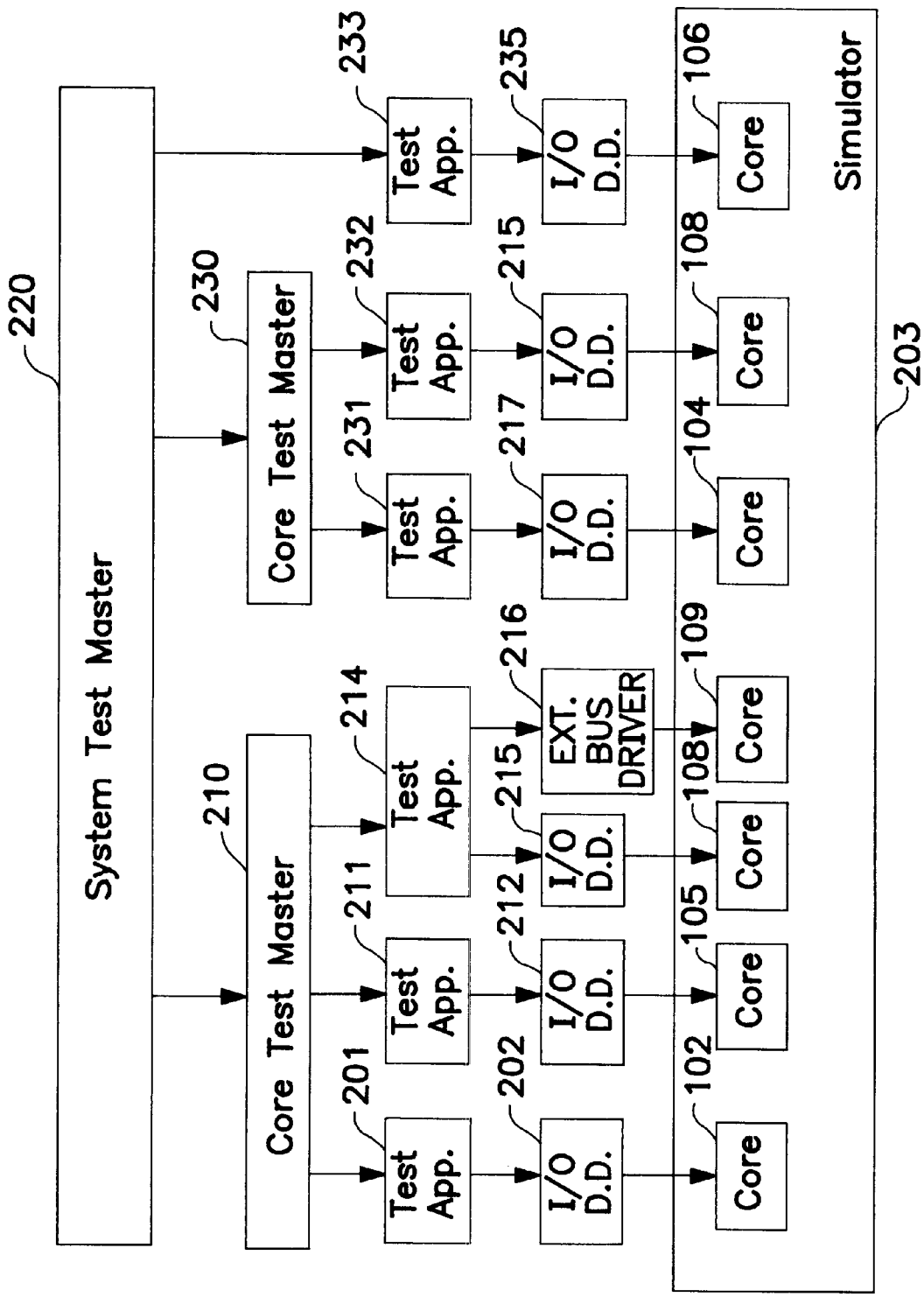

A more general depiction of the TOS 200 is shown in FIGS. 2B and 2C. The TOS 200 is hierarchically organized. An upper level of the TOS may comprise a core test master 2and a plurality of test applications such as test applications 201, 211 and 214, or include a still higher level such as a system test master 220 as shown in FIG. 2C. The upper-level code performs such functions as decision-making, test initialization, test randomization, multi-tasking, and comparison of test results with expected results.

FIG. 2B represents test applications 201, 211 and 214 executing under the control of a core test master 210. Each test application corresponds to a particular core 102, 105, 108 and 109 being tested. As shown, the LLDDs may be, more particularly, I/O device drivers such as 202, 212 and 215 which perform operations on cores internal to the SOC 100, and external bus drivers such as 216 which perform operations on cores external to the SOC.

FIG. 2C shows a system test master 220 controlling core test masters 210 and 230, which in turn control their respective test applications. The system test master also controls a test application 233 paired with a core 106 via a LLDD 235.

The LLDDs 202, 212, 215, 216, 217 and 235 of FIGS. 2B and 2C represent a low level of the TOS 200. The LLDDs provide an interface between the higher-level software such as the system test masters, core test masters and the test applications, and the core being simulated. Because the cores being simulated correspond to target hardware (i.e., the physical elements which will ultimately implement the design logic), operations on the cores occur on a hardware level. These operations are performed by the LLDDs, and include register I/O and interrupt handling. In an embodiment, the operations on the cores typically comprise DCR read and writes (i.e., read and writes to the processor's DCR bus), memory-mapped I/O, and memory reads and writes. A DCR bus 111 (see FIG. 1) is typically used in Power PC® architected processors for programming registers in peripheral cores. Memory-mapped I/O refers to a known technique of programming core registers using standard memory read and writes which are decoded to core register addresses.

Figure 3:
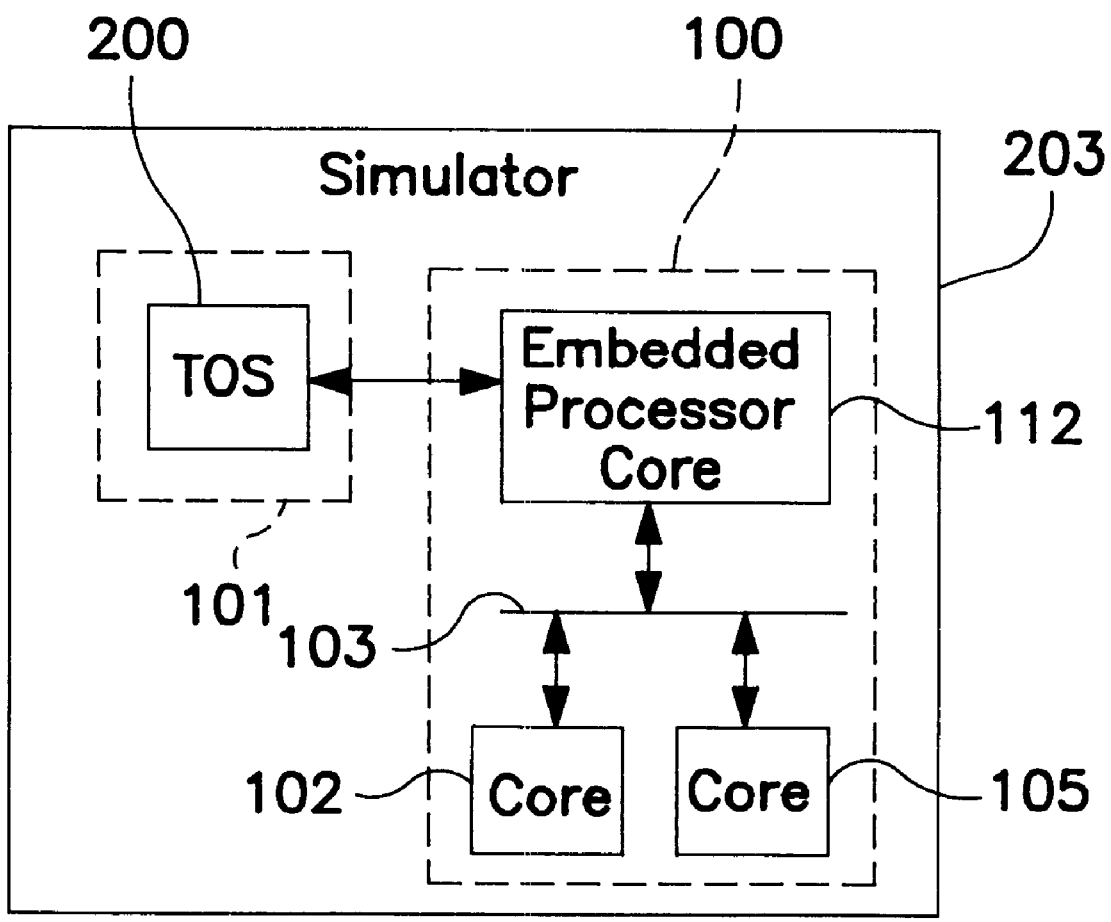
FIG. 3 shows the TOS being executed by an embedded processor in simulation.

As shown in FIG. 3, the TOS software may be loaded into memory core 101 and executed by the embedded processor 112 within the simulator 203. The TOS software being executed applies a verification test as described above to one or more cores, for example cores 102 and 105 as shown. As noted above, in general the elements of the TOS apart from the processor driver are coded in a high-level programming language, such as "C", to provide for portability across SOC designs, hardware platforms and from simulation to a hardware implementation of a SOC design.

Figure 4:
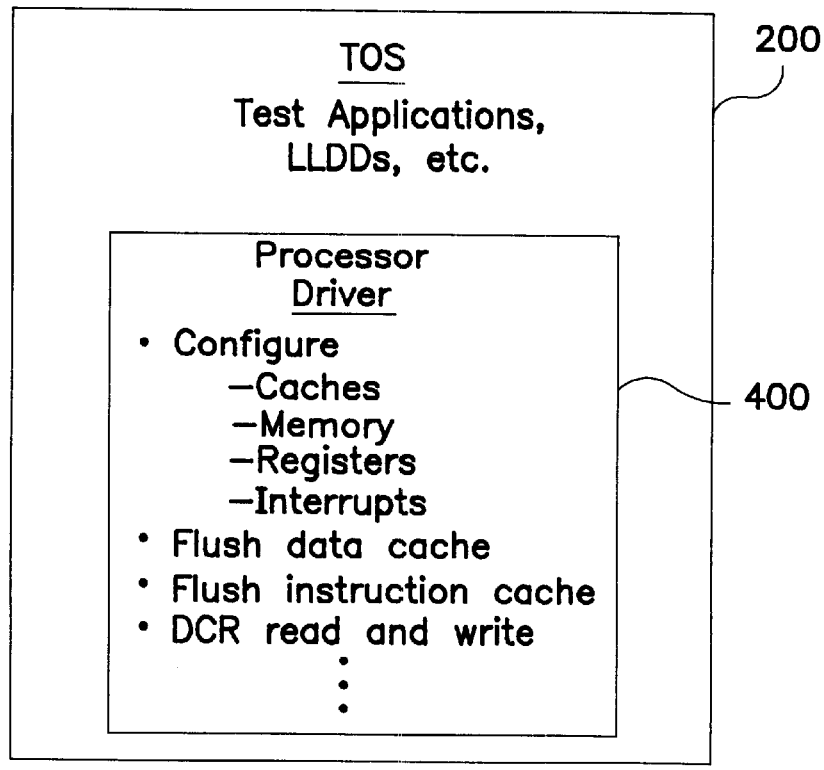
FIG. 4 shows the localization of processor-specific operations in a processor driver.

As shown in FIG. 4, according to the method of the present invention, processor-specific operations of the TOS are localized in the processor driver 400. The operations shown, i.e., configuring caches, memory, registers and interrupts, flushing caches, and DCR read and writes are examples of operations implemented in processor-specific code; e.g., in a processor-specific assembly language coded for the particular embedded processor 112 being used in the SOC design. For example, a first type of processor might have caches of a different size from a second processor, or utilize a different set of interrupts. In order to utilize each different type of processor in a verification test as described above, each processor needs to be configured according to its unique requirements. By isolating the processor-specific operations in the processor driver 400 as shown, if an embedded processor 112 of a first type is replaced by one of a second and different type, only the processor driver 400 needs to be changed or replaced to adjust for the change in processor type, and not the rest of the TOS verification code.

The processor-specific operations localized in the processor driver would be invoked, for example, for processor initialization. Typically, prior to its use for executing the TOS code, a processor such as embedded processor 112 must be initialized. Initialization of a processor entails, for example, initializing its instruction and data caches, resetting timers and status registers, and configuring interrupts and memory.

Examples of processor-specific operations apart from initialization which would typically be requested of the processor driver 400 from test applications and LLDDs during a verification test include flushing the instruction and data caches of the processor and performing DCR reads and writes.

A test application may, for example, need to flush the instruction or data cache, which causes a dump of the cache contents to memory so that the test application can check them. Further, the LLDDs typically perform DCR read and writes in a verification test, along with memory-mapped I/O and memory reads and writes.

Figure 5:
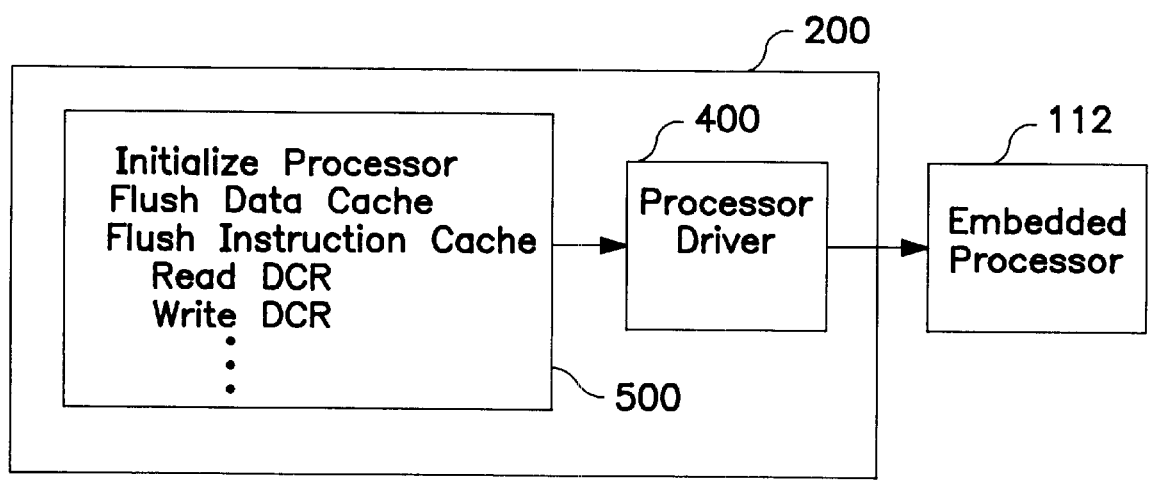
FIG. 5 shows the TOS invoking the processor driver via a uniform interface to perform processor-specific operations on an embedded processor.

As shown in FIG. 5, to invoke the processor driver, the TOS utilizes a uniform API 500 comprising a group of functions called from the TOS software, each identified by a name or mnemonic generally descriptive of a processor operation which invokes the processor driver but requires no processor-specific information. Thus, "Initialize Processor", "Flush Data Cache", etc. in API 500 represent high-level function calls utilized by the balance of the TOS software to invoke the processor driver 400 to perform the corresponding processor-specific operations on the embedded processor 112. Use of this processor-independent API allows for the balance of the TOS code to be easily re-compiled without change when the processor changes, requiring only the processor driver to be changed. The processor driver 400 invoked by the API 500 would be whichever driver was specific to a particular embedded processor 112 being used in a verification test.

Figure 6:
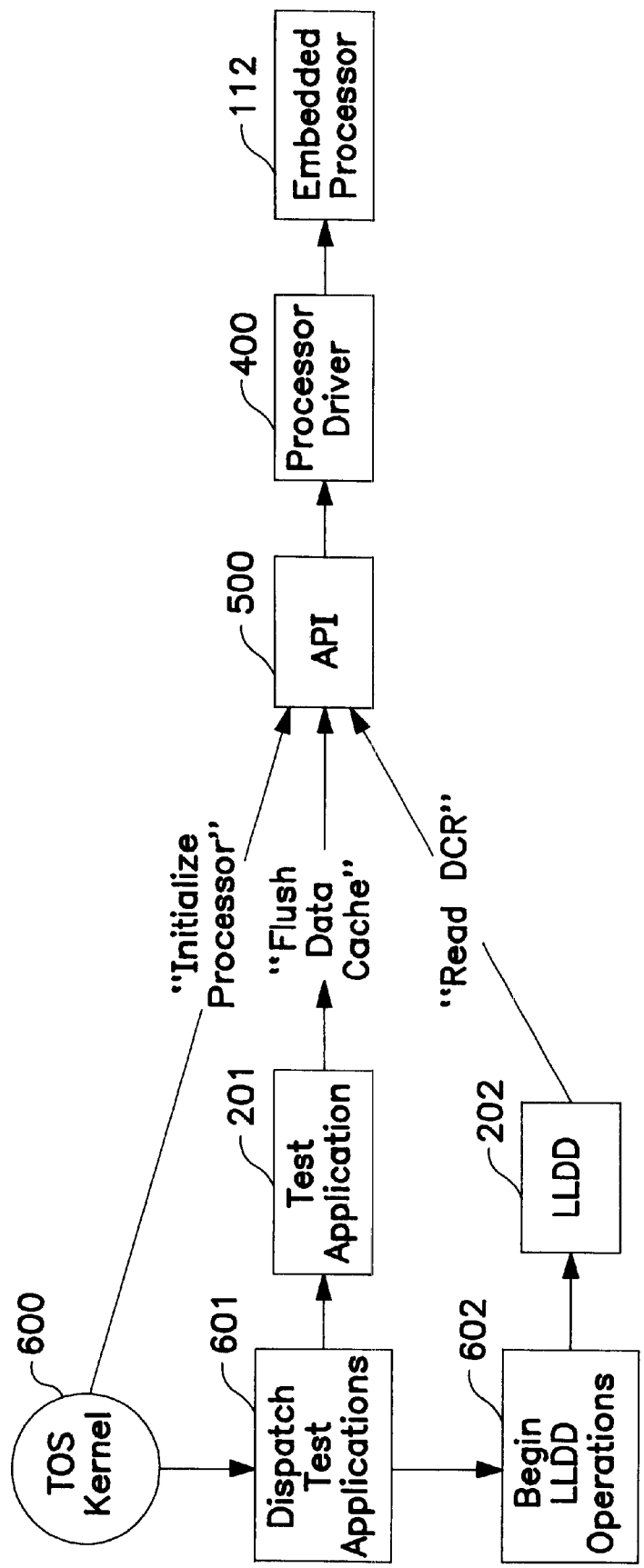
FIG. 6 shows the execution flow of a verification test in which the verification software invokes the processor driver via a uniform interface.

FIG. 6 illustrates usage of the processor driver 400 and API 500 in a verification test. Typically, at the start-up of a verification test, a TOS kernel 600 calls an initialization function in the API 500, to invoke the processor driver 400 to perform initialization of the embedded processor 112. In response, the processor driver executes processor-specific (typically assembly) instructions which configure the processor.

Subsequently, the TOS goes on to perform a verification test of a core or cores using test applications, LLDDs and test masters as described above. A top-level control program such as a core test master 210 or system test master 220 defines a selection of test applications to be dispatched by the TOS as shown in block 601. After being dispatched, the test applications pass user-defined messages to their corresponding LLDDs to begin hardware level operations on their corresponding cores, as shown in block 602.

During the verification test, a test application such as 201 may require a processor-specific operation to flush the data cache. To effect this, the test application calls "Flush Data Cache" in the API 500, which invokes the corresponding processor-specific operations by the processor driver 400 on the embedded processor. Similarly, if an LLDD such as 202 needs to perform a DCR read or write, it calls the required function in the API 500 to invoke the corresponding processor-specific operations by the processor driver.

The foregoing further illustrates how the uniform API 500 isolates the balance of the TOS code from the processor type. A processor of a first type, for example, may be a Power PC (r) processor having a DCR bus, while a processor of a second type does not have a DCR bus. The uniform API 500 would be the same in a verification test using either processor. However, if, for example, an LLDD issued a DCR read or write via the API with the processor of the second type in the verification test, the processor driver coded specifically for that processor would simply return to the LLDD, performing no operation in response. Or, the processor of the second type might have some analogous function to a DCR read or write which would be effected by the processor driver. In either case, the test applications and LLDDs may be compiled to execute a test without any changes.

It may be appreciated from the foregoing that the method of the present invention increases the efficiency of SOC verification and thus reduces time-to-market, since the type of processor used in a verification test may be readily changed. Using a different processor in the test entails only coding a corresponding processor driver, or selecting an existing processor driver already coded for that particular processor. Errors due to processor-specific code distributed throughout the rest of the verification software are eliminated, since the processor-specific code is centralized in the processor driver.

Figure 7:
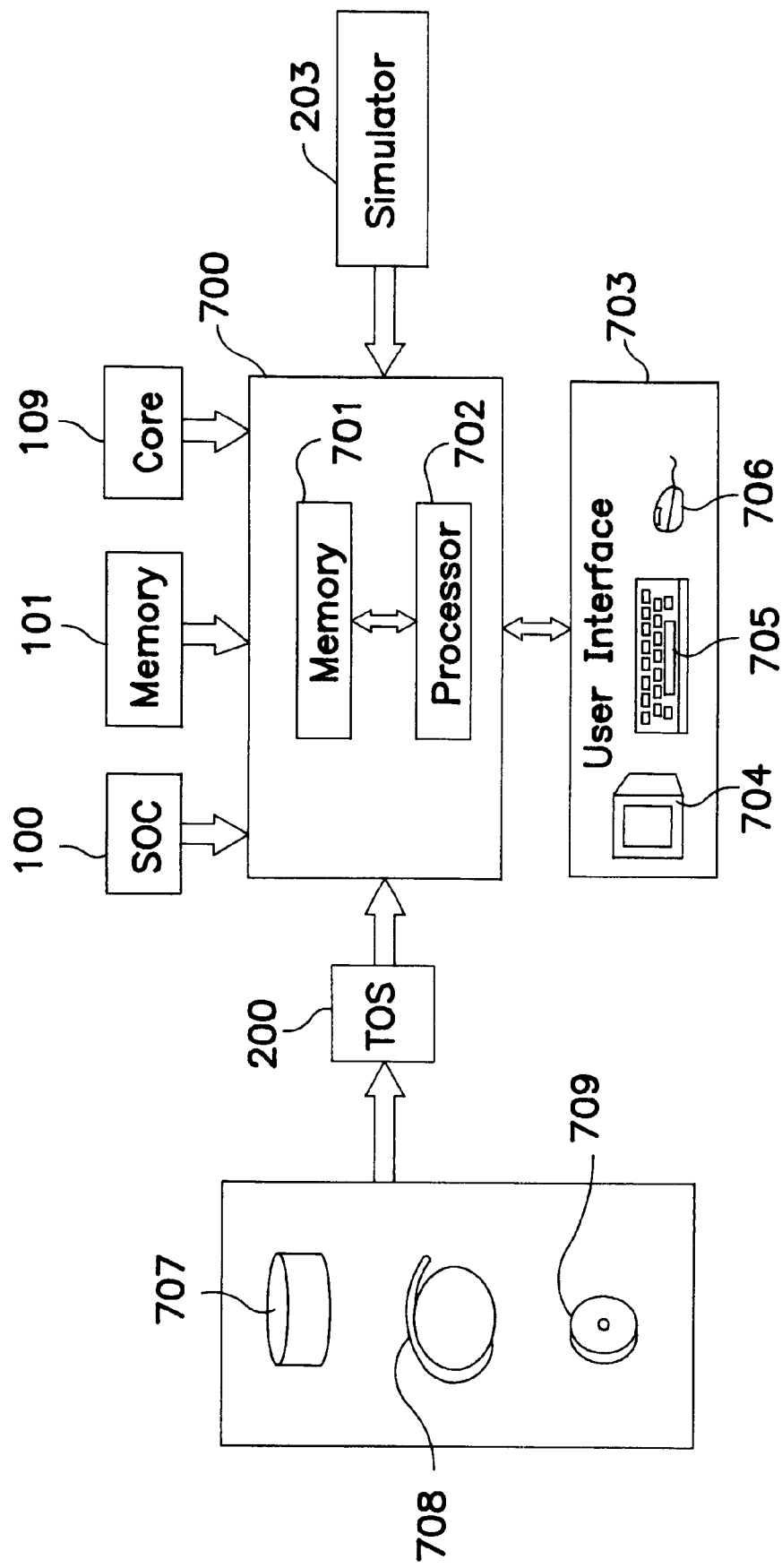
FIG. 7 shows a general purpose computer system for executing software according to the invention.

FIG. 7 illustrates a general purpose computer system representing a hardware platform for executing software according to the invention. The system includes a computer 700 comprising a memory 701 and a processor 702 which may be embodied, for example, in a workstation. The system further includes a user interface 703 comprising a display device 604 and user-input devices such as a keyboard 705 and mouse 706 for purposes of, for example, initiating and controlling a simulation session and observing simulation status and results.

The TOS 200, as noted above, may be implemented as computer-executable instructions which may be stored on a computer-usable medium such as disk 707, tape 708 or CD-ROM 709. The instructions may be read from a computer-usable medium as noted into the memory 701 and executed by the processor 702 to effect the advantageous features of the invention.

The simulator 203 may be any of a variety of commercially-available simulators, including event simulators, cycle simulators and instruction set simulators. The simulator may run on the same workstation 700 as the TOS. As described above, the TOS may be executed entirely in the simulator by the simulated embedded processor 112.

Typically, additional inputs to the computer 700 would include the SOC 100 being verified and external cores such as the memory core 101 and external driver core 109, embodied as simulatable HDL modules. The processor 700 would execute the simulator (simulation software) 203, which would use the input simulatable modules to simulate the behavior of corresponding hardware devices in response to instructions executed by the TOS 200.

As noted above, in a preferred embodiment, the computer-executable instructions which implement the TOS 200 are written in a high-level language such as "C". However, the programming structures and functionality disclosed herein for practicing the invention may find specific implementations in a variety of forms using other programming languages, which implementations are considered to be within the abilities of a programmer of ordinary skill in the art after having reviewed the specification.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

The invention claimed is:

1. A method for developing verification software for verification of a system-on-chip design including an embedded processor, comprising:
    coding a processor driver for performing processor-specific operations on said embedded processor; and
    coding said verification software to invoke said processor driver to perform said processor-specific operations,
    wherein said verification software is coded using only processor-independent function calls.

2. The method of claim 1, further comprising coding a uniform interface used by said verification software for invoking said processor driver.

3. The method of claim 1, wherein said processor driver is invoked for initialization of said processor.

4. A method for performing verification of a system-on-chip design including an embedded processor, comprising:
    (a) providing verification code for applying a test case to said design;
    (b) providing a processor driver for performing processor-specific operations on said embedded processor; and
    (c) executing said verification code to invoke said processor driver to perform said processor-specific operations,
        wherein said executed verification code invokes said processor driver by only using processor-independent function calls.

5. The method of claim 4, wherein said step (c) includes using a uniform interface to invoke said processor driver to perform said processor-specific operations.

6. The method of claim 4, wherein said step (c) is performed during an initialization of said processor.

7. The method of claim 4, wherein said operations includes cache, register and memory configuration.

8. A computer-usable medium storing computer-executable instructions for performing verification of a system-on-chip design including an embedded processor, said instructions comprising both a processor-independent portion and a processor-specific portion;
    wherein said processor-independent portion invokes said processor-specific portion to perform processor-specific operations on said processor.

9. The computer-usable medium of claim 8, further including a uniform interface used by said processor-independent portion of said instructions to invoke said processor-specific portion.

10. The computer-usable medium of claim 8, wherein said operations are performed during an initialization of said processor.

11. A system for performing verification of a system-on-chip design including an embedded processor, comprising:
    a simulator which simulates said system-on-chip design,
    a processor-specific driver which performs processor-specific operations on said embedded processor; and
    verification software which invokes said processor-specific driver to perform said operations,
    wherein said verification software only uses processor-independent functions to invoke said processor-specific driver.

12. The system of claim 11, further including a uniform interface used by said verification software to invoke said processor-specific driver.

13. The system of claim 11, wherein said operations include cache, register and memory configuration.

14. The system of claim 11, wherein said operations are performed during an initialization of said processor.

15. The system of claim 14, wherein subsequent to said initialization, said verification software applies a test case to said design, said test case including instructions invoking said processor driver to perform said processor-specific operations.

16. The method for developing verification software of claim 1, wherein said verification software is capable of interacting, without any change, with various different embedded processor types after only the processor driver is modified.

17. The method for performing verification of a system-on-chip design of claim 4, wherein said verification code is capable of interacting, without any change, with various different embedded processor types after only the processor driver is modified.

18. The computer-usable medium of claim 8, wherein said processor-independent portion is capable of interacting, without any change, with various different embedded processor types after only the processor processor-specific portion is modified.

19. The system for performing verification of a system-on-chip design of claim 11, wherein said verification software is capable of interacting, without any change, with various different embedded processor types after only the processor-specific driver is modified.

* * * * *